(12) United States Patent
Hsieh et al.

(10) Patent No.: US 11,632,849 B2
(45) Date of Patent: Apr. 18, 2023

(54) METHOD AND APPARATUS FOR MITIGATING CONTAMINATION

(71) Applicant: TAIWAN SEMICONDUCTOR MANUFACTURING COMPANY, LTD., Hsinchu (TW)

(72) Inventors: Chieh Hsieh, Taoyuan (TW); Tai-Yu Chen, Hsinchu (TW); Hung-Jung Hsu, Hsinchu (TW); Cho-Ying Lin, Hsinchu (TW); Shang-Chieh Chien, New Taipei (TW); Li-Jui Chen, Hsinchu (TW); Heng-Hsin Liu, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/460,144

(22) Filed: Aug. 27, 2021

(65) Prior Publication Data
US 2023/0064840 A1    Mar. 2, 2023

(51) Int. Cl.
*G03F 7/20* (2006.01)
*H05G 2/00* (2006.01)

(52) U.S. Cl.
CPC ......... *H05G 2/008* (2013.01); *G03F 7/70033* (2013.01); *G03F 7/7055* (2013.01); *G03F 7/70916* (2013.01); *H05G 2/005* (2013.01)

(58) Field of Classification Search
CPC .... H05G 2/008; H05G 2/005; G03F 7/70033; G03F 7/7055; G03F 7/70916
See application file for complete search history.

(56) References Cited

U.S. PATENT DOCUMENTS

| | | | |
|---|---|---|---|
| 2002/0090054 A1* | 7/2002 | Sogard | G03F 7/70033 378/119 |
| 2004/0013226 A1* | 1/2004 | Bakker | B82Y 10/00 378/34 |
| 2008/0179548 A1* | 7/2008 | Bykanov | H05G 2/003 250/504 R |
| 2013/0161510 A1* | 6/2013 | O'Connor | H01J 49/0463 250/288 |

* cited by examiner

*Primary Examiner* — Hung V Nguyen
(74) *Attorney, Agent, or Firm* — McDermott Will & Emery LLP

(57) ABSTRACT

A shutter is provided near the immediate focus of a lithography apparatus in order to deflect tin debris generated by a source side of the apparatus away from a scanner side of the apparatus and towards a debris collection device. The activation of the shutter is synchronized with the generation of light pulses so as not to block light from entering the scanner side.

16 Claims, 9 Drawing Sheets

METHOD AND APPARATUS FOR MITIGATING CONTAMINATION

BACKGROUND

One growing technique for semiconductor manufacturing is extreme ultraviolet (EUV) lithography. EUV employs scanners using light in the EUV spectrum of electromagnetic radiation, including wavelengths from about one nanometer (nm) to about one hundred nm. Many EUV scanners still utilize projection printing, similar to various earlier optical scanners, except EUV scanners accomplish it with reflective rather than refractive optics, that is, with mirrors instead of lenses.

EUV lithography employs a laser-produced plasma (LPP), which emits EUV light. The LPP is produced by focusing a high-power laser beam, from a carbon dioxide ($CO_2$) laser and the like, onto small fuel droplet targets of tin (Sn) in order to transition it into a highly-ionized plasma state. This LPP emits EUV light with a peak maximum emission of about 13.5 nm or smaller. The EUV light is then collected by a collector and reflected by optics towards a lithography exposure object, such as a semiconductor wafer. Tin debris is generated in the process, which debris can adversely affect the performance and efficiency of the EUV apparatus.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
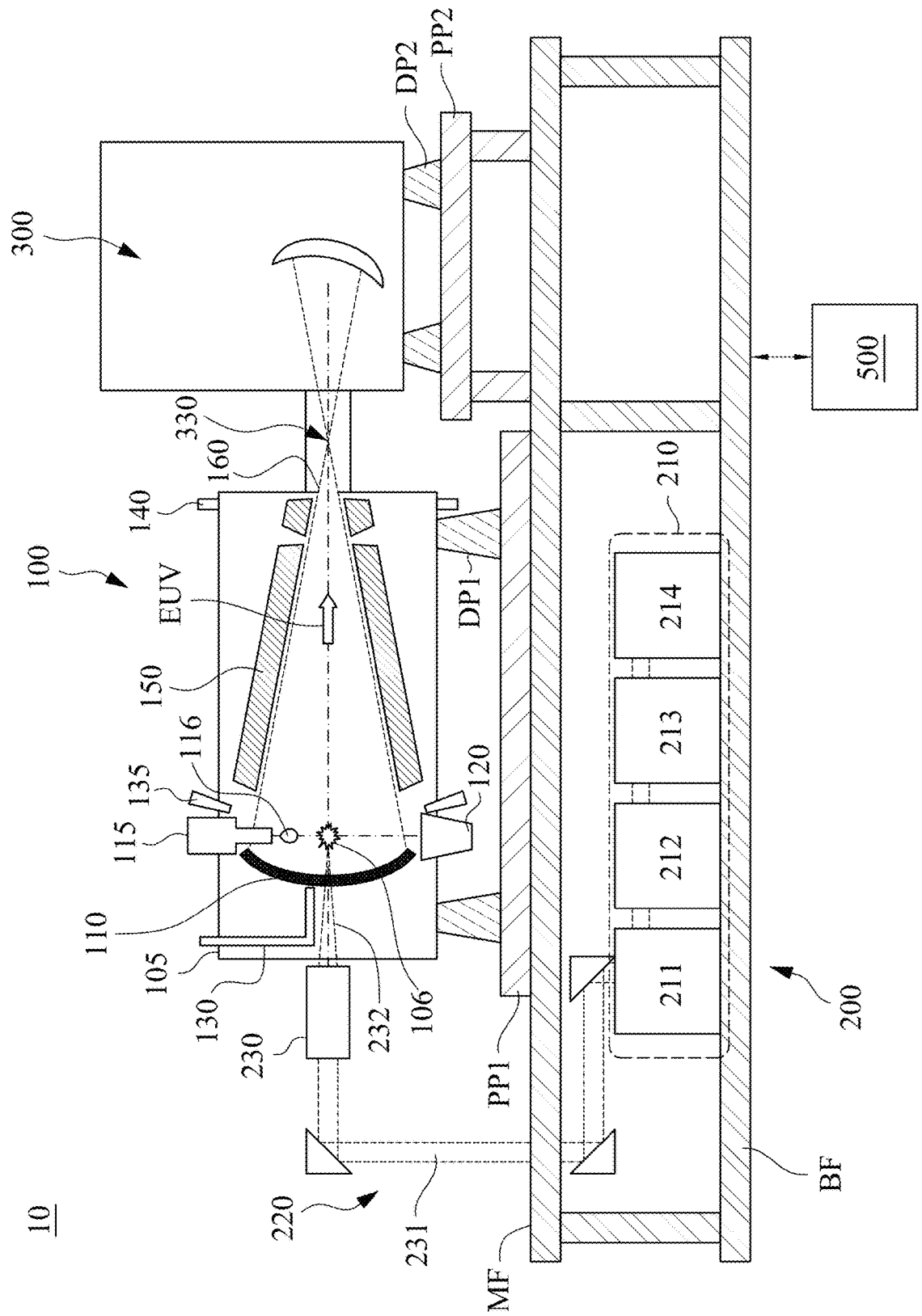
FIG. 1A is a diagram of a lithography apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic," as used herein, is not meant to be limited to components which operate solely within one or more specific wavelength range(s) such as at the EUV output light wavelength, the irradiation laser wavelength, a wavelength suitable for metrology or any other specific wavelength.

In the present disclosure, the terms mask, photomask, and reticle are used interchangeably. In the present embodiment, the mask is a reflective mask. One embodiment of the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers deposited on the substrate. The multiple layers include a plurality of film pairs, such as molybdenum-silicon (Mo/Si) film pairs (e.g., a layer of molybdenum above or below a layer of silicon in each film pair). Alternatively, the multiple layers may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the multiple layers. The absorption layer is patterned to define a layer of an integrated circuit (IC). Alternatively, another reflective layer may be deposited over the multiple layers and is patterned to define a layer of an integrated circuit, thereby forming an EUV phase shift mask.

In the present embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform various lithography exposing processes. The lithography system may further include other modules or be integrated with (or be coupled with) other modules.

A lithography system is essentially a light projection system. Light is projected through a 'mask' or 'reticle' that constitutes a blueprint of the pattern that will be printed on a workpiece. The blueprint is four times larger than the intended pattern on the wafer or chip. With the pattern encoded in the light, the system's optics shrink and focus the pattern onto a photosensitive silicon wafer. After the pattern is printed, the system moves the wafer slightly and makes another copy on the wafer. This process is repeated until the wafer is covered in patterns, completing one layer of the eventual semiconductor device. To make an entire microchip, this process will be repeated one hundred times or more, laying patterns on top of patterns. The size of the features to be printed varies depending on the layer, which means that different types of lithography systems are used for different layers, from the latest-generation EUV systems for the smallest features to older deep ultraviolet (DUV) systems for the largest.

FIG. 1A is a schematic and diagrammatic view of an EUV lithography system 10. The EUV lithography system 10 includes an EUV radiation source apparatus 100 (sometimes referred to herein as a "source side" in reference to it or one or more of its relevant parts) to generate EUV light, an exposure tool 300, such as a scanner, and an excitation laser source apparatus 200. As shown in FIG. 1A, in some embodiments, the EUV radiation source apparatus 100 and the exposure tool 300 are installed on a main floor (MF) of a clean room, while the excitation laser source apparatus 200 is installed in a base floor (BF) located under the main floor. Each of the EUV radiation source apparatus 100 and the exposure tool 300 are placed over pedestal plates PP1 and PP2 via dampers DP1 and DP2, respectively. The EUV radiation source apparatus 100 and the exposure tool 300 are coupled to each other at a junction 330 by a coupling mechanism, which may include a focusing unit (not shown).

The EUV lithography system 10 is designed to expose a resist layer to EUV light (or EUV radiation). The resist layer is a material sensitive to the EUV light. The EUV lithography system 10 employs the EUV radiation source apparatus 100 to generate EUV light having a wavelength ranging between about 1 nanometer (nm) and about 100 nm. In one particular example, the EUV radiation source apparatus 100 generates EUV light with a wavelength centered at about 13.5 nm. In various embodiments, the EUV radiation source apparatus 100 utilizes LPP to generate the EUV radiation.

As shown in FIG. 1A, the EUV radiation source apparatus 100 includes a target droplet generator 115 and an LPP collector 110, enclosed by a chamber 105. The target droplet generator 115 generates a plurality of target droplets 116. In some embodiments, the target droplets 116 are tin (Sn) droplets. In some embodiments, the target droplets 116 have a diameter of about 30 microns ($\mu m$). In some embodiments, the target droplets 116 are generated at a rate about fifty droplets per second and are introduced into an excitation zone 106 at a speed of about seventy meters per second (m/s or mps). Other material can also be used for the target droplets 116, for example, a liquid material such as a eutectic alloy containing Sn and lithium (Li).

As the target droplets 116 move through the excitation zone 106, pre-pulses (not shown) of the laser light first heat the target droplets 116 and transform them into lower-density target plumes. Then, the main pulse 232 of laser light is directed through windows or lenses (not shown) into the excitation zone 106 to transform the target plumes into a LPP. The windows or lenses are composed of a suitable material substantially transparent to the pre-pulses and the main pulse 232 of the laser. The generation of the pre-pulses and the main pulse 232 is synchronized with the generation of the target droplets 116. In various embodiments, the pre-heat laser pulses have a spot size about 100 $\mu m$ or less, and the main laser pulses have a spot size about 200-300 $\mu m$. A delay between the pre-pulse and the main pulse 232 is controlled to allow the target plume to form and to expand to an optimal size and geometry. When the main pulse 232 heats the target plume, a high-temperature LPP is generated. The LPP emits EUV radiation, which is collected by one or more mirrors of the LPP collector 110. More particularly, the LPP collector 110 has a reflection surface that reflects and focuses the EUV radiation for the lithography exposing processes. In some embodiments, a droplet catcher 120 is installed opposite the target droplet generator 115. The droplet catcher 120 is used for catching excess target droplets 116 for example, when one or more target droplets 116 are purposely or otherwise missed by the pre-pulses or main pulse 232.

As shown the target droplet generator 115 generates tin droplets along a vertical axis. Each droplet is hit by a $CO_2$ laser pre-pulse (PP). The droplet will responsively change its shape into a "pancake" during travel along the axial direction. After a time duration (MP to PP delay time), the pancake is hit by a $CO_2$ laser main (MP) proximate to a primary focus (PF) in order to generate an EUV light pulse. The EUV light pulse is then collected by an LPP collector 100 and delivered to the scanner side for use in wafer exposure.

The LPP collector 110 includes a proper coating material and shape to function as a mirror for EUV collection, reflection, and focusing. In some embodiments, the LPP collector 110 is designed to have an ellipsoidal geometry. In some embodiments, the coating material of the collector 100 is similar to the reflective multilayer of an EUV mask. In some examples, the coating material of the LPP collector 110 includes multiple layers, such as a plurality of molybdenum/silicon (Mo/Si) film pairs, and may further include a capping layer (such as ruthenium (Ru)) coated on the multiple layers to substantially reflect the EUV light.

The main pulse 232 is generated by the excitation laser source apparatus 200. In some embodiments, the excitation laser source apparatus 200 includes a pre-heat laser and a main laser. The pre-heat laser generates the pre-pulse that is used to heat or pre-heat the target droplet 116 in order to create a low-density target plume, which is subsequently heated (or reheated) by the main pulse 232, thereby generating increased emission of EUV light.

The excitation laser source apparatus 200 may include a laser generator 210, laser guide optics 220 and a focusing apparatus 230. In some embodiments, the laser generator 210 includes a carbon dioxide ($CO_2$) laser source or a neodymium-doped yttrium aluminum garnet (Nd:YAG) laser source. The laser light 231 generated by the laser generator 210 is guided by the laser guide optics 220 and focused into the main pulse 232 of the excitation laser by the focusing apparatus 230, and then introduced into the EUV radiation source apparatus 100 through one or more apertures, such as the aforementioned windows or lenses.

In such an EUV radiation source apparatus 100, the LPP generated by the main pulse 232 creates physical debris, such as ions, gases and atoms of the droplet 116, along with the desired EUV light. In operation of the lithography system 10, there is an accumulation of such debris on the LPP collector 110, and such physical debris exits the chamber 105 and enters the exposure tool 300 (i.e., the "scanner side") as well as the excitation laser source apparatus 200.

In various embodiments, a buffer gas is supplied from a first buffer gas supply 130 through the aperture in the LPP collector 110 by which the main pulse 232 of laser light is delivered to the tin droplets 116. In some embodiments, the buffer gas is hydrogen ($H_2$), helium (He), argon (Ar), nitrogen ($N_2$), or another inert gas. In certain embodiments, $H_2$ is used, since H radicals generated by ionization of the buffer gas can also be used for cleaning purposes. Furthermore, $H_2$ absorbs the least amount of EUV light produced by the source side, and thus absorbs the least light used by the semiconductor manufacturing operations performed in the scanner side of the lithography apparatus 10. The buffer gas can also be provided through one or more second buffer gas supplies 135 toward the LPP collector 110 and/or around the edges of the LPP collector 110. Further, and as described in more detail later below, the chamber 105 includes one or more gas outlets 140 so that the buffer gas is exhausted outside the chamber 105.

Hydrogen gas has low absorption of the EUV radiation. Hydrogen gas reaching to the coating surface of the LPP collector 110 reacts chemically with a metal of the target droplet 116, thus forming a hydride, e.g., metal hydride. When Sn is used as the target droplet 116, stannane ($SnH_4$), which is a gaseous byproduct of the EUV generation process, is formed. The gaseous $SnH_4$ is then pumped out through the outlet 140. However, it is difficult to exhaust all gaseous $SnH_4$ from the chamber and to prevent the Sn debris and $SnH_4$ from entering the exposure tool 300 and the excitation laser source apparatus 200. To trap the Sn, $SnH_4$ or other debris, one or more debris collection mechanisms or devices 150 are employed in the chamber 105. In various embodiments, a controller 500 controls the EUV lithography system 10 and/or one or more of its components shown in and described above with respect to FIG. 1A.

A large amount of Sn debris at high speed will be generated during EUV exposure. Most of the Sn debris will be carried out by a scrubber in conjunction with a high density $H_2$ flow. However, a portion of the Sn particles will evade the $H_2$ flow protection and reach the interface between source and scanner chambers. Then, Sn particles will be accelerated by a large pressure delta toward the reticle in various embodiments.

Figure 1B:
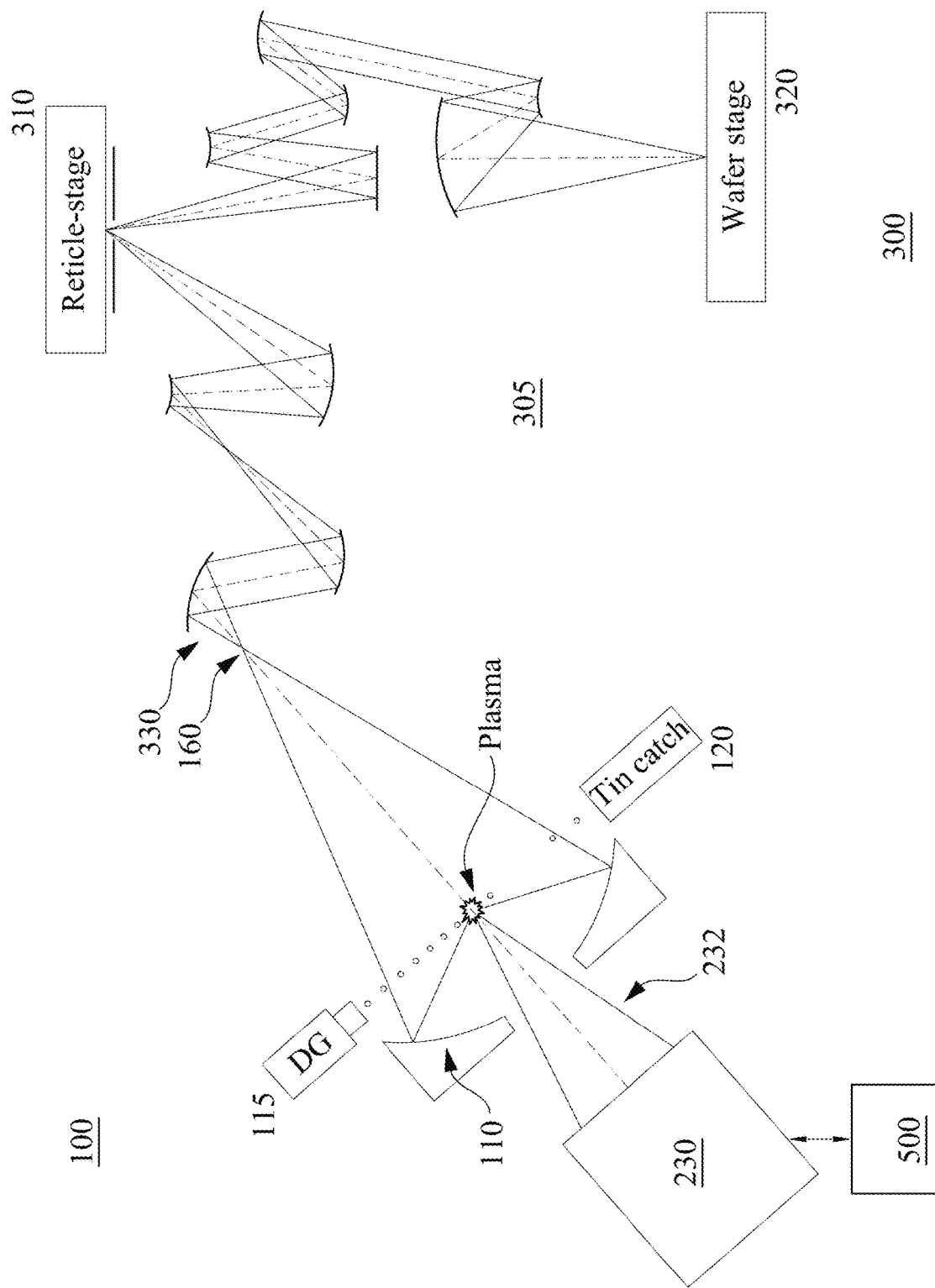
FIG. 1B is a diagram of a source side and a scanner side in accordance with some embodiments.

As shown in FIG. 1B, the exposure tool 300 (sometimes referred to herein as the "scanner side" in reference to it or one or more of its relevant parts) includes various reflective optic components, such as convex/concave/flat mirrors, a mask holding mechanism 310 including a mask stage (i.e., a reticle stage), and wafer holding mechanism 320. The EUV radiation generated by the EUV radiation source apparatus 100 and focused at intermediate focus 160 is guided by the reflective optical components 305 onto a mask (not shown) secured on the reticle stage 310, also referenced as a mask stage herein. In some embodiments, the distance from the intermediate focus 160 and the reticle disposed in the scanner side is approximately 2 meters. In some embodiments, the reticle size is approximately 152 mm by 152 mm. In some embodiments, the reticle stage 310 includes an electrostatic chuck, or 'e-chuck,' (not shown) to secure the mask. The EUV light patterned by the mask is used to process a wafer supported on wafer stage 320. Because gas molecules absorb EUV light, the chambers and areas of the lithography system 10 used for EUV lithography patterning are maintained in a vacuum or a low-pressure environment to avoid EUV intensity loss. In various embodiments, the controller 500 controls one or more of the components of the EUV lithography system 10 as shown in and described with respect to FIG. 1B.

Figure 1C:
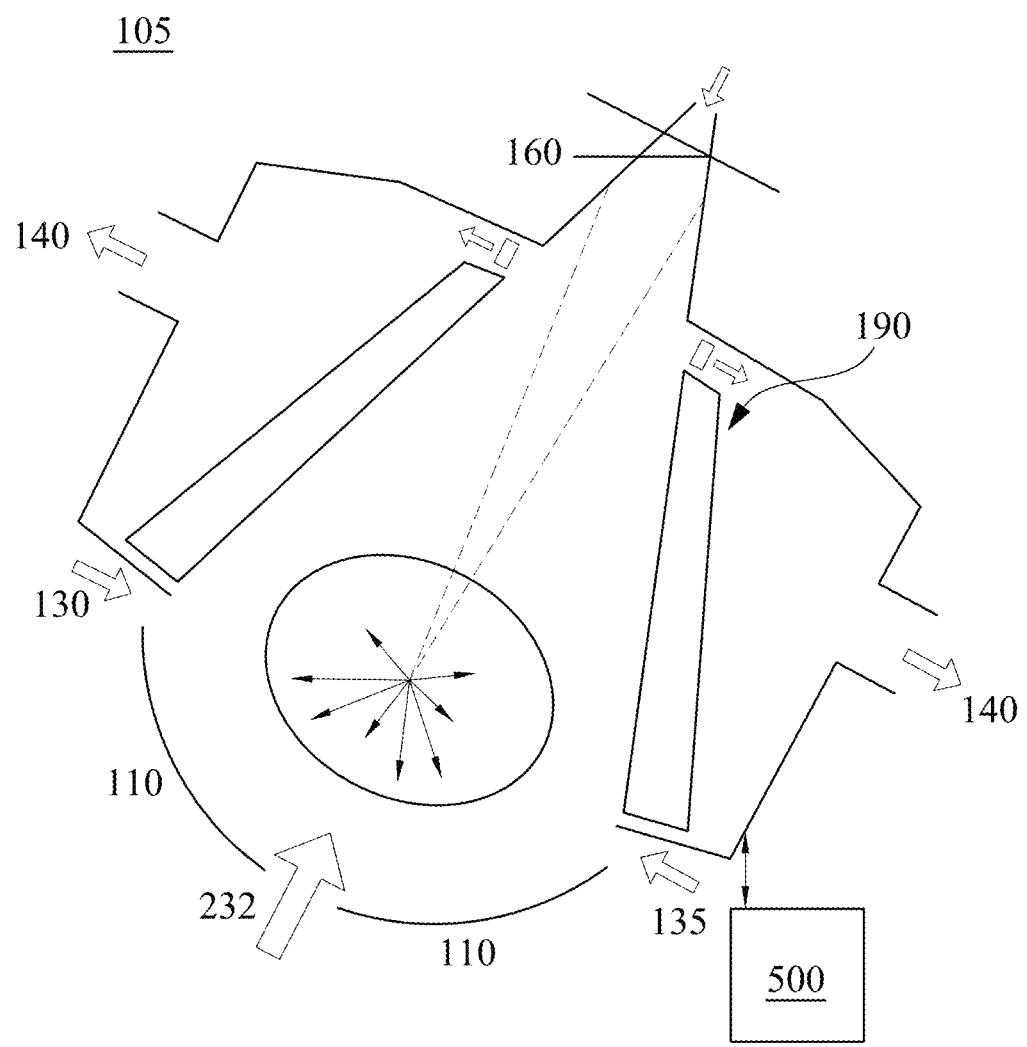
FIG. 1C is a diagram of laser and optics components in accordance with some embodiments.

FIG. 1C shows further detail of the chamber 105 of the EUV radiation source apparatus 100, in which the relation of the LPP collector 110, the buffer gas supply 130, the second buffer gas supply 135, the gas outlet ports 140 and the intermediate focus 160 are illustrated. The main pulse 232 of the laser light is directed through the LPP collector 110 to the excitation zone 106 where it irradiates a target plume to form an LPP. The LPP emits EUV light that is collected by the LPP collector 110 and then directed through the intermediate focus 160 toward the exposure tool 300 for use in patterning a wafer as described previously. In various embodiments, the controller 500 controls one or more of the components of the EUV lithography system 10 as shown in and described with respect to FIG. 1C.

In various embodiments of the EUV lithography system 10, pressure in the LPP source side is higher than pressure in the scanner side. This is because the source side uses hydrogen gas to force the removal of airborne Sn debris therefrom, while the scanner side is maintained in near vacuum in order to avoid diminishing strength of the EUV light (being absorbed by air molecules) or otherwise interfering with the semiconductor manufacturing operations performed therein. In various embodiments, the intermediate focus 160 is disposed at a junction 330 or intersection of the source side and the scanner side. As EUV light or radiation is generated, at least 50% of the mass of each tin droplet used to form the LPP does not vaporize, but instead becomes numerous tin nanoparticles ranging in diameter from 30 nm to 100 nm. Detrimentally, the nanoparticles also flow from the source side to scanner side through the intermediate focus 160 in the same general direction as the light generated by the source side. In various embodiments, the tin debris attains speeds of 1000-2000 m/s during the EUV light generation process. Also, the hydrogen purge gas may cause sputtering of the tin particles that accumulate on the chamber walls of the source side. In various embodiments, these particles can become airborne with speeds of 100-200 m/s. Also, due to the pressure differential between the source side and the scanner side, these nanoparticles attain high momenta. The momenta of the Sn nanoparticles entering the intermediate focus 160 are thus very large. With speeds and velocities of 1000 m/s or more, such nanoparticles attain nominal momenta of up to approximately $3.67 \times 10^{-16}$ kgm/s. In some embodiments, nanoparticles that migrate to the scanner side due to the pressure difference fall on the reticle and wafer, thereby detrimentally leading to a higher incidence of defects in the semiconductor manufacturing operations performed by the lithography apparatus 10.

It has been observed that, with a distance of about 1.3-1.4 meters from the point of light generation to the end of the intermediate focus 160, there is not sufficient time to deflect Sn nanoparticles by using an electromagnetic (EM) field or the like alone. This is due to the short amount of time between nanoparticle debris generation and arrival of the nanoparticles at the intermediate focus 160. The strength of any EM field must also be limited so that it does not interfere with the operation of other components of the lithography apparatus 10, which makes it ineffective alone against nanoparticle with a high momentum. Embodiments of the present disclosure prevent tin nanoparticles from flying onto the reticle by using a synchronized shutter disposed in proximity to the intermediate focus, either alone or in combination with a low level EM field.

Figure 2A:
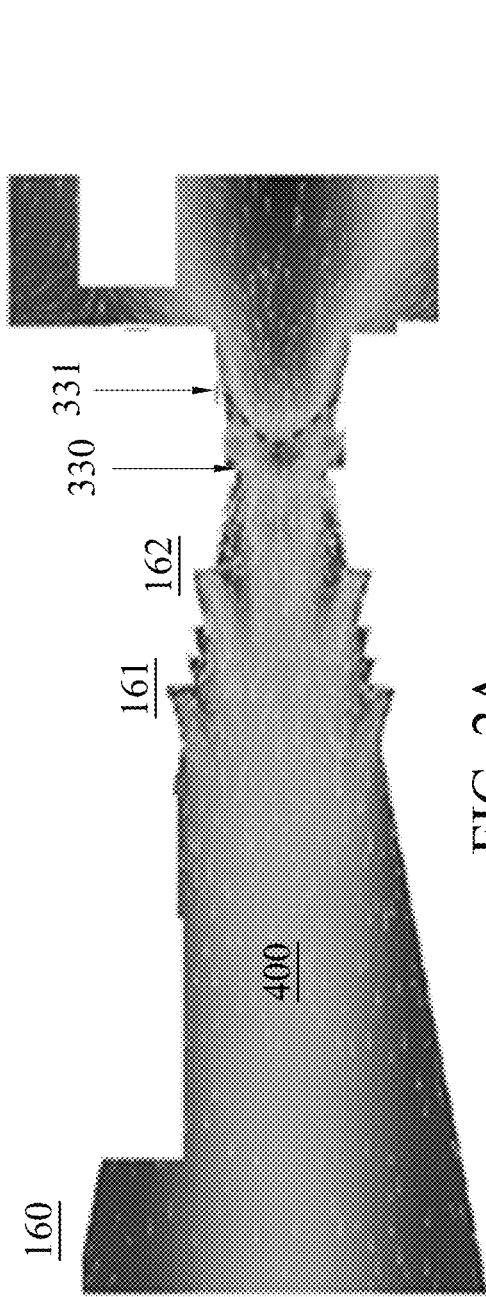
FIG. 2A is a diagram of a junction of an intermediate focus and a scanner side in accordance with some embodiments.

FIG. 2A is a diagram of a junction 330 of an intermediate focus 160 and a scanner side in accordance with some embodiments. As shown in FIG. 2A, nanoparticles 400 generated by the source side enter the intermediate focus 160 before impinging on the scanner side and, in various embodiments, flow in the same general direction, on average, as the general direction of the light generated by the source side. In some embodiments, purge gas is introduced in the source side near the point where the LPP is generated and/or in the scanner side near the junction 330. In some embodiments, one or more gas suppliers are configured such that a gas flow rate at the source side is greater than a gas flow rate at the scanner side. In various embodiments, the intermediate focus 160 includes purge gas inlet ports 161, 162 to assist in purging nanoparticle debris before it reaches the junction 300 and the scanner side. However, it has been observed that only approximately 10% of the debris is removed by the various scrubbers and purge gases in the source side as described above.

Figure 2B:
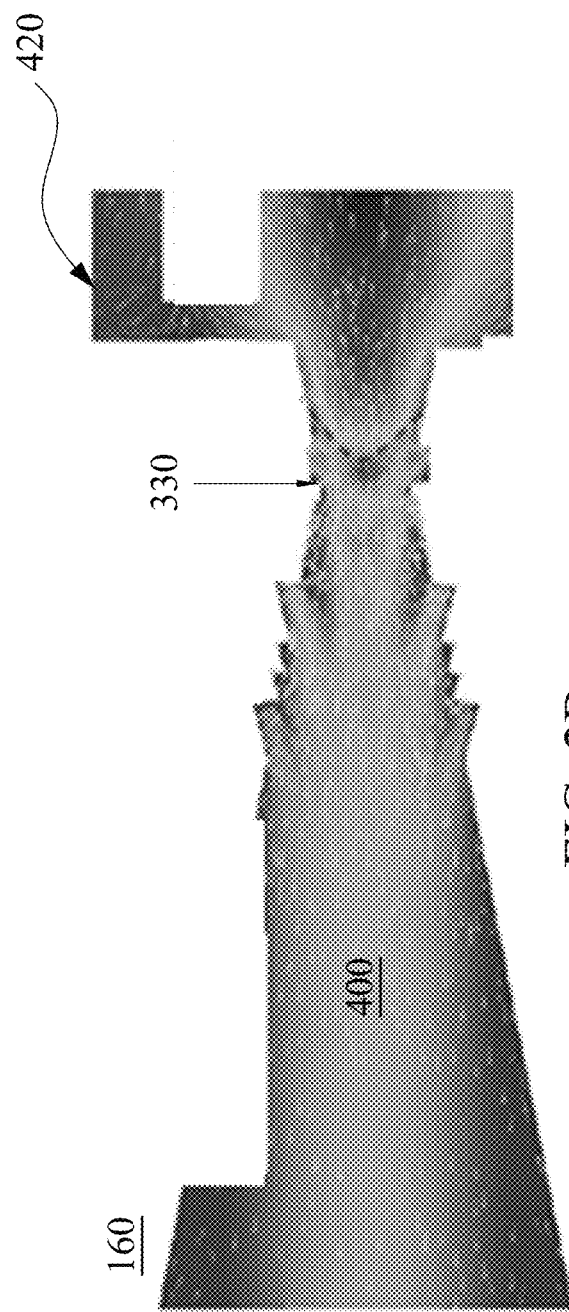
FIG. 2B is a diagram of a shutter placed in proximity to an intermediate focus in accordance with some embodiments.

Accordingly, as shown in FIG. 2B, a shutter 420 is placed in proximity to an intermediate focus 160 in accordance with some embodiments. In such embodiments, the shutter 420 prevents the nanoparticles 400 which have entered the intermediate focus 160 from crossing into the scanner side. In some embodiments, the shutter 420 is disposed on the source side. In other embodiments, the shutter 420 is disposed on the scanner side.

In some embodiments, the nanoparticles 400 are deflected by the shutter 420 toward a debris collector 190 (see, FIG. 1C) disposed in the source side proximate to the intermediate focus 160. In some embodiments, the outlets 140 (see, FIG. 1C) act as the debris collector 190. In some embodiments, the nanoparticles 400 are deflected and/or blocked by the shutter 420 toward the debris collection mechanisms or devices 150 in the source side. In some embodiments, one or more debris collectors 190 are disposed on the scanner side. In some embodiments, debris collectors 190 are disposed in both the source and scanner sides.

Figure 2C:
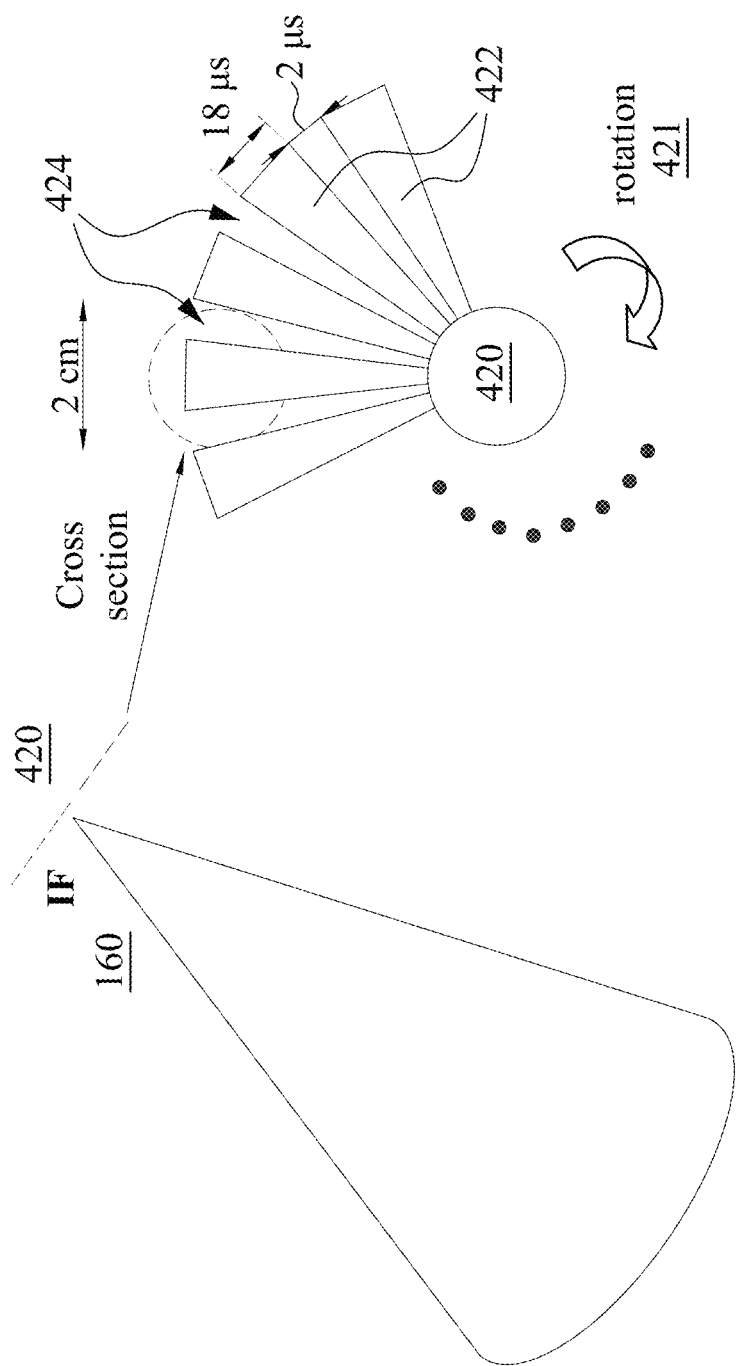
FIG. 2C is a diagram of a shutter in accordance with some embodiments.

FIG. 2C is a diagram of one embodiment of a shutter 420 in accordance with some embodiments. In some embodiments, the shutter 420 includes one or more blades 422 that are connected at a central point thereby forming a fan configuration. In some embodiments, the blades are disposed equidistantly all the way around the central portion. The blades 422 rotate with the central portion in the direction of rotation 421 shown, in some embodiments. In various embodiments, the blades 422 are rotated in a clockwise or counterclockwise rotational direction. In some embodiments, one or more gaps 424 are disposed between the blades 422. In various embodiments, the width of the blades 422 are such that the rate of rotation of the shutter 420 places a blade 422 in a position that blocks the junction 330 when the LPP is not generated (i.e., the off time of the LPP). The widths of the gaps 424 are such that the rate of rotation of the shutter 420 places the gap in conjunction with the junction 330 such that the LPP passes through to the scanner side unimpeded during an on time of the light pulse.

For example, in various embodiments where the LPP is 50 kilohertz (kHz), i.e. up to 50,000 time per second, the widths of the blades 422 and/or the rate of rotation of the shutter 420 are set such that each blade 422 blocks the junction 330 for 18±0.1 µs and each gap 424 coincides with the junction 330 for 2±0.1 µs, thereby covering each 20 µs duty cycle of the LPP. With the blades 422 blocking the junction 330 for 90% of each duty cycle of light generation in such embodiments, 90% of the generated tin debris is correspondingly prevented from entering the scanner side. In various embodiments, the width of the blades 422 and the gaps 424 on each side may be approximately 2.0±0.1 cm to accommodate the opening of the junction 300 which is of similar size. In various embodiments, the fan-like motion of the rotating blades 422 prevents the migration of tin debris into the scanner side by generating a counter-directional flow in the area of the junction 330. In various embodiments, the ratio of the blade width to the gap width is proportional to the ratio of off-time to on-time in the duty cycle of the LPP pulse. For example, where the duty cycle is 90% off time to 10% on time, the ratio of the blade width to gap width is 9:1.

Figure 2D:
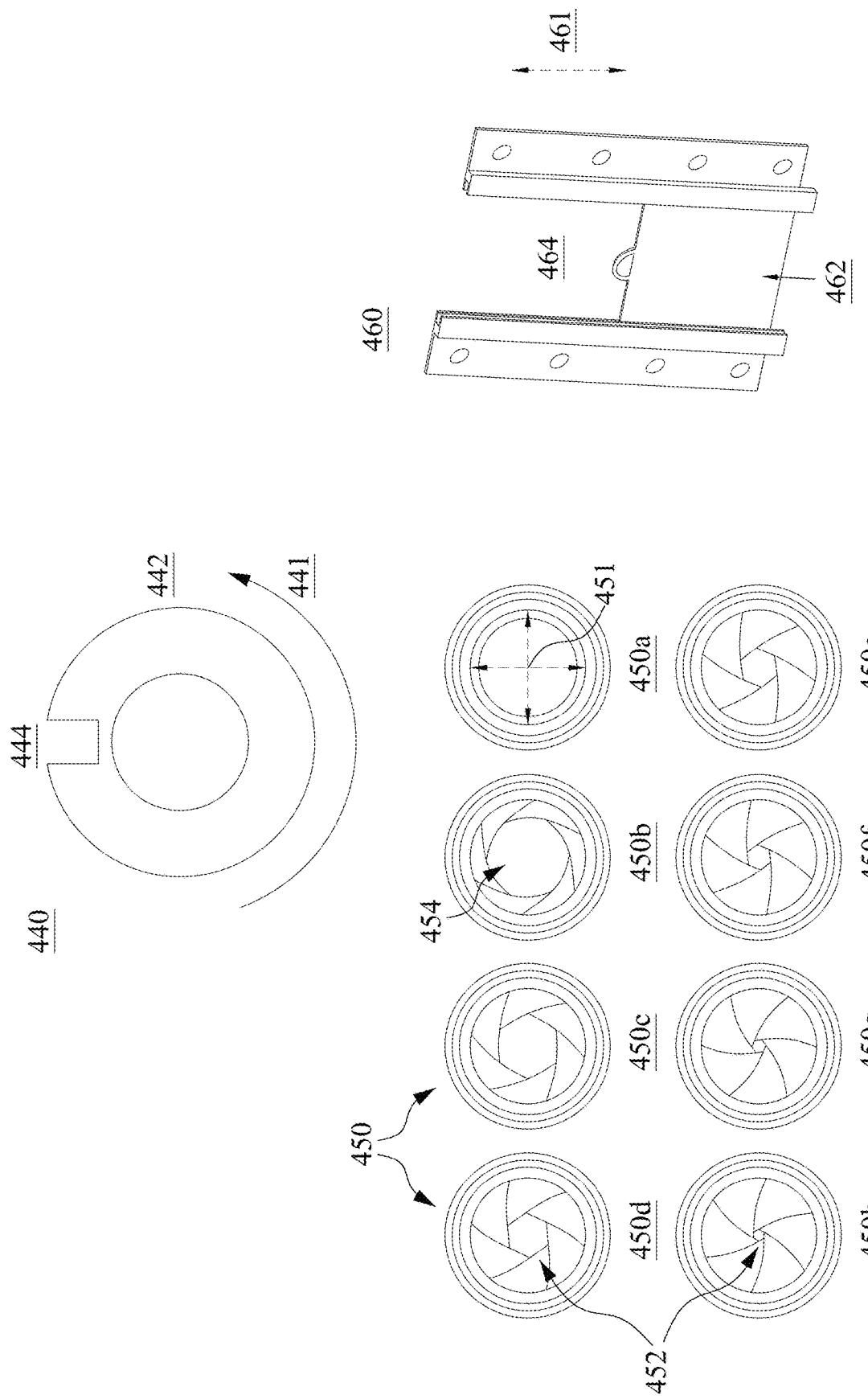
FIG. 2D is a diagram of alternate designs for the shutter in accordance with some embodiments.

FIG. 2D is a diagram of various alternate designs for the shutter 420 in accordance with some embodiments. A first alternate shutter design 440 includes a single blade 442 disposed around a central portion to deflect debris during an off time of the LPP in some embodiments. In various embodiments, a gap 444 for allowing light to pass through is disposed in one or more places along the blade 442. The blade 442 may rotate in the rotational direction 441 in synchronization with generation of light pulses such that the blade 442 blocks the junction 330 only during an off time of the LPP to deflect nanoparticles 400 away from the scanner side and the gap 444 coincides with the junction 330 during an on time of the LPP to allow the light to continue to the scanner side for use in a semiconductor manufacturing process performed by the apparatus 10. In some embodiments, the dimensions of the gap 444 is comparable to the gap 424 of FIG. 2C. In various embodiments, the blade 442 may have multiple gaps 444. In various embodiments, the gaps 444 may be slits or circular holes in the blade 442.

A second alternate shutter design 450 that may be used in place of the shutter 420 includes a plurality of blades 452 that move in linear, non-rotating directions 451 to form a gap or aperture 454 that may increase or decrease in size in conjunction with the motion of the blades 452. The second alternate shutter design 450 operates in a manner analogous to a well-known camera lens aperture, in various embodiments. As the blades 455 progressively close, the aperture 454 decreases accordingly in size, and as the blades 452 progressively retract, the aperture 454 increases in size. This can be seen as the blades 452 progressively close in view 450a to view 450b to view 450c to view 450d to view 450e to view 450f to view 450g and finally to view 450h where each of the blades 452 are fully extended and the aperture 454 is fully closed. Proceeding in the reverse direction, views 450h-450a show how the blades 452 retract and the aperture 454 increasingly opens. In various embodiments, the shutter 450 operates such that the aperture 454 coincides with the junction 330, is fully closed during an off period of the LPP light pulse and is fully open during an on period of the LPP light pulse. In some embodiments, the dimensions of the fully open aperture 454 are comparable to the gap 424 of FIG. 2C.

A third alternate shutter design 460 that may be used in place of the shutter 420 includes a single blade 462 that moves in a linear, non-rotating direction 461 to form a gap or aperture 464 that may increase or decrease in size in conjunction with the motion of the blade 462. In some embodiments, the blade 462 moves up and down linearly in the vertical direction as illustrated. In some embodiments, blade 462 moves back and forth linearly in a horizontal direction. In various embodiments, the blade 462 is moved into the position of the gap 464 during an off time of the LPP pulse in order to deflect nanoparticle debris. In various embodiments, the blade 462 is retracted such that the gap 464 coincides with the junction 330 in order to allow an LPP to pass to the scanner side during an on time of the light pulse. In various embodiments of the shutters described above, such shutters and their blades must be periodically cleaned of tin debris buildup and the like.

Figure 3:
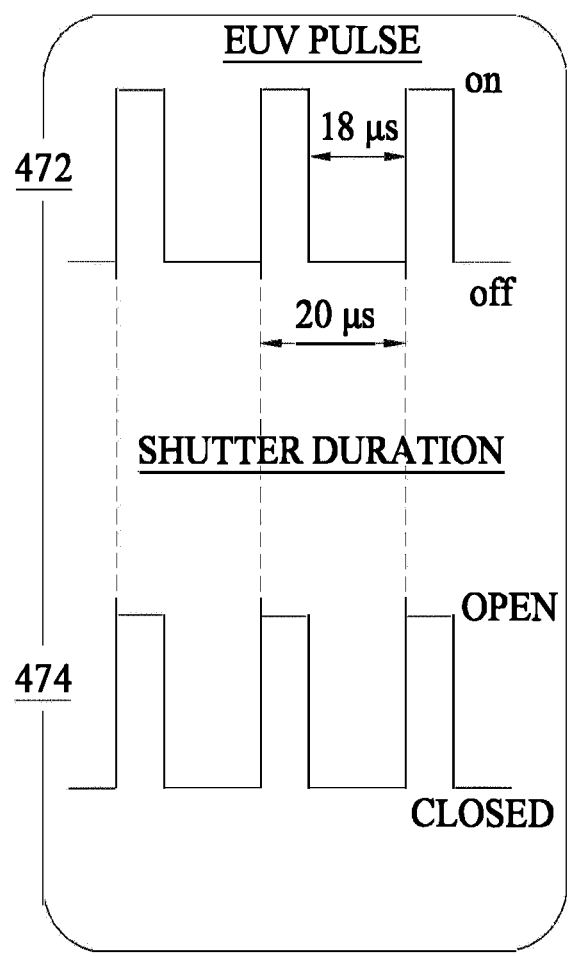
FIG. 3 is a diagram of EUV light pulses and shutter operation in accordance with some embodiments.

FIG. 3 is a diagram 470 of EUV light pulse trains 472 and shutter duration operation 474 in accordance with some embodiments. In various embodiment, the LPP is generated with a 20 μs pulse length or duty cycle. In some embodiments, the on period of the light pulse is 10% of the duty cycle or 2 μs and the off period of the light pulse is 90% of the duty cycle or 18 μs. In various embodiments, the on time may vary from 0.06 μs to 2.0 μs. In various embodiments, the shutters 420, 440, 450 460 are sized and synchronized such that they are open during light generation, and closed when light pulse is off and/or the lithography apparatus 10 is otherwise idle. In some embodiments, the closed time of the various shutters may be less than the duration of the off-period of the LPP, but this results in allowing correspondingly more debris through the junction 330 to the scanner side. However, the closed time of the shutters may not extend into the on time of the LPP light pulse, which would negatively impact the efficiency of the lithography apparatus 10. In various embodiments, a shutter time delay of approximately 1-2 microseconds is allowed, so long as the delay does not impede the EUV light pulses from reaching the scanner side. Accordingly, in some embodiments where the off time of the LPP light pulse is 18 μs the closed time caused by the blade 422 may be between 16 and 18 μs.

Figure 4:
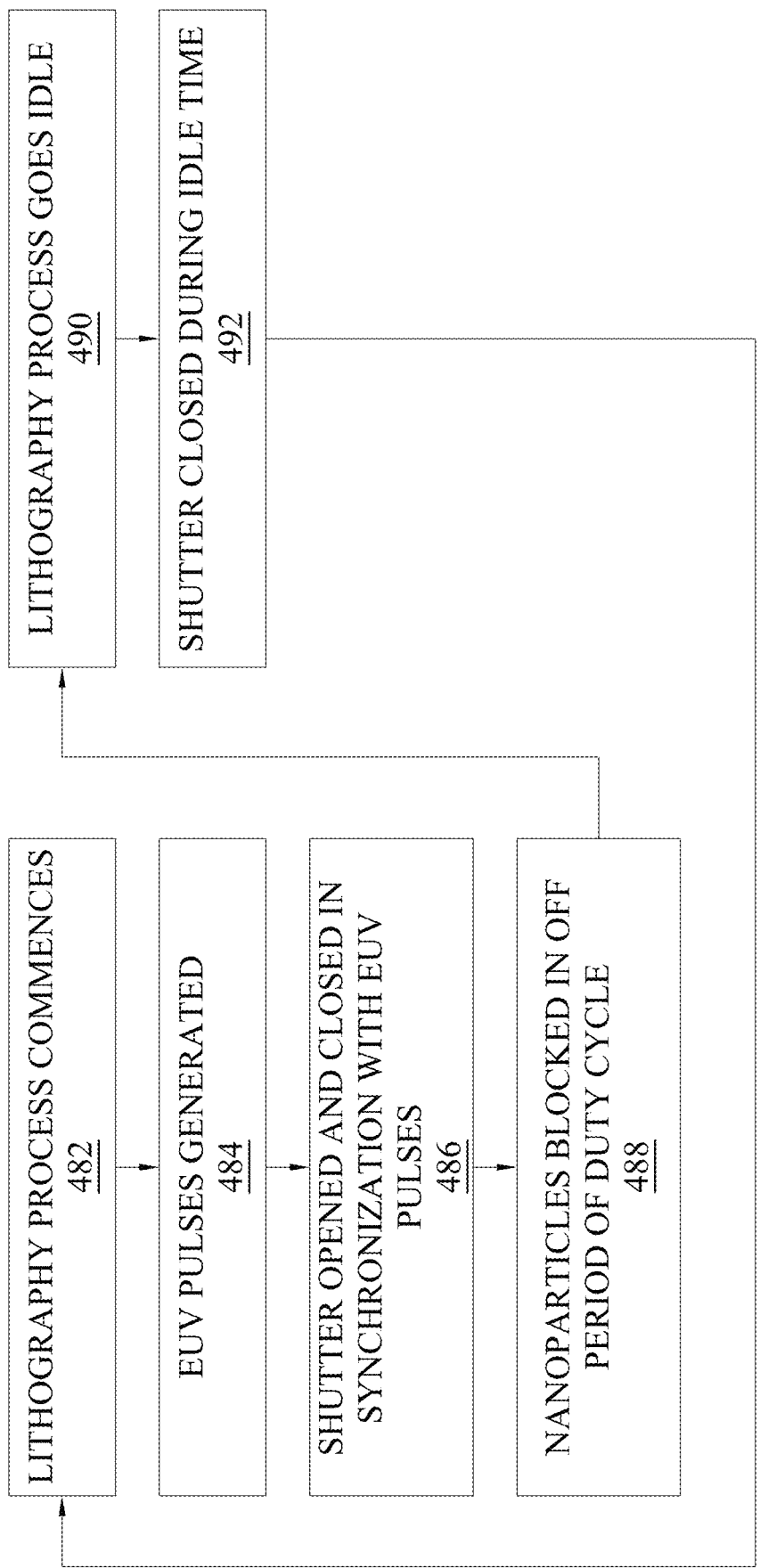
FIG. 4 is a flowchart of a shuttering process in accordance with some embodiments.

FIG. 4 is a flowchart depicting a shuttering process 480 according to various embodiments. As a lithography process is started by the lithography apparatus 10 (operation 482), EUV light pulses are generated (operation 484) along with corresponding nanoparticle debris 400. The shutter 420 is opened and closed in synchronization with the duty cycle of the EUV pulses (operation 486). In such manner, the nanoparticles 400 are blocked by the blades 422 of the shutter 420 during the off periods of the duty cycle of light generation (operation 488). Whenever the lithography process goes idle (operation 490), the shutter remains in the closed position (operation 492) such that the one or more blades of the shutter block the junction 330.

Figure 5A:
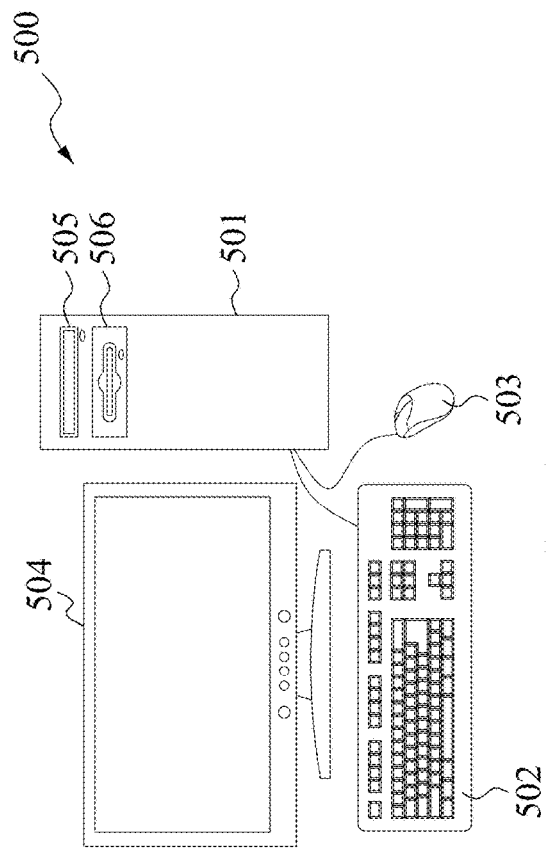
FIG. 5A and FIG. 5B are diagrams of a controller in accordance with some embodiments.
Figure 5B:
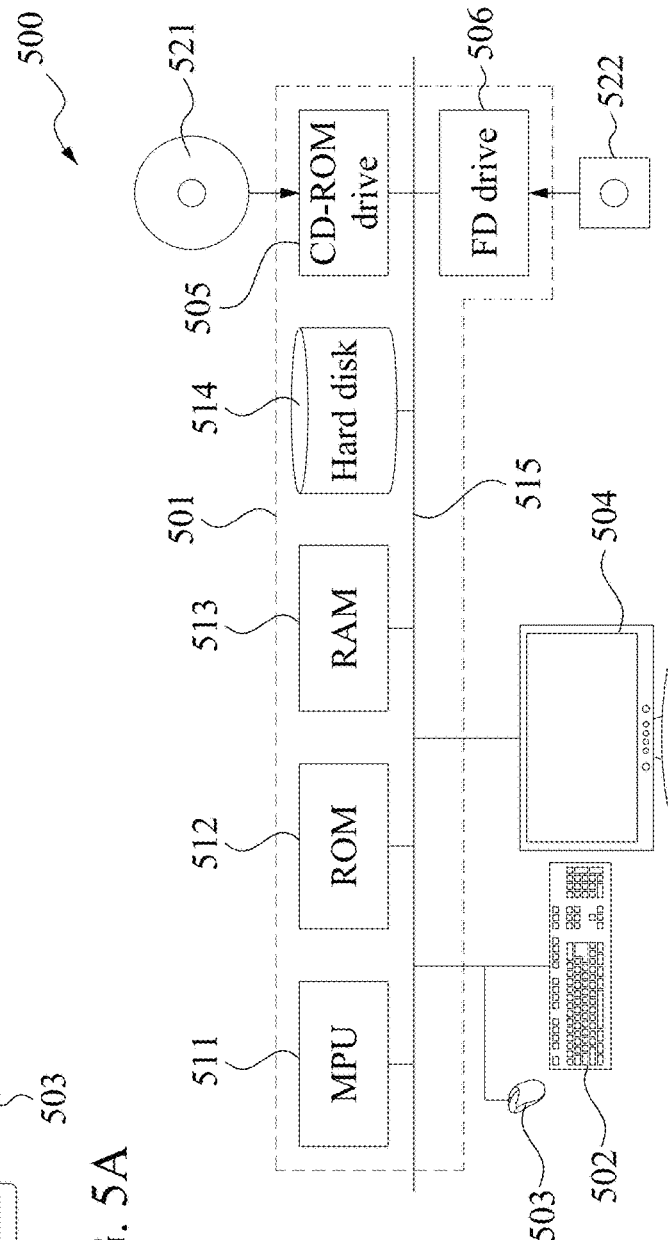

FIG. 5A and FIG. 5B illustrate a computer system 500 for controlling the system 10 and its components in accordance with various embodiments of the present disclosure. FIG. 5A is a schematic view of a computer system 500 that controls the system 10 of FIGS. 1A-1C. In some embodiments, the computer system 500 is programmed to initiate a process for monitoring contamination levels of chamber components, wafer holding tools or airborne contamination arising from the same and provide an alert that cleaning is required. In some embodiments, manufacturing of semiconductor devices is halted in response to such an alarm. As shown in FIG. 5A, the computer system 500 is provided with a computer 501 including an optical disk read only memory (e.g., CD-ROM or DVD-ROM) drive 505 and a magnetic disk drive 506, a keyboard 502, a mouse 503 (or other similar input device), and a monitor 504.

FIG. 5B is a diagram showing an internal configuration of the computer system 500. In FIG. 5B, the computer 501 is provided with, in addition to the optical disk drive 505 and the magnetic disk drive 506, one or more processors 511, such as a micro-processor unit (MPU) or a central processing unit (CPU); a read-only memory (ROM) 512 in which a program such as a boot up program is stored; a random access memory (RAM) 513 that is connected to the processors 511 and in which a command of an application program is temporarily stored, and a temporary electronic storage area is provided; a hard disk 514 in which an application program, an operating system program, and data are stored; and a data communication bus 515 that connects the processors 511, the ROM 512, and the like. Note that the computer 501 may include a network card (not shown) for providing a connection to a computer network such as a local area network (LAN), wide area network (WAN) or any other useful computer network for communicating data used by the computer system 500 and the system 10. In various embodiments, the controller 500 communicates via wireless or hardwired connection to the system 10 and its components.

The program for causing the computer system 500 to execute the process for controlling the system 10 of FIGS. 1A-1C, and components thereof and/or to execute the process for the method of manufacturing a semiconductor device according to the embodiments disclosed herein are stored in an optical disk 521 or a magnetic disk 522, which is inserted into the optical disk drive 505 or the magnetic disk drive 506, and transmitted to the hard disk 514. Alternatively, the program is transmitted via a network (not shown) to the computer system 500 and stored in the hard disk 514. At the time of execution, the program is loaded into the RAM 513. The program is loaded from the optical disk 521 or the magnetic disk 522, or directly from a network in various embodiments.

The stored programs do not necessarily have to include, for example, an operating system (OS) or a third party program to cause the computer 501 to execute the methods disclosed herein. The program may only include a command portion to call an appropriate function (module) in a controlled mode and obtain desired results in some embodiments. In various embodiments described herein, the controller 500 is in communication with the lithography system 10 to control various functions thereof.

The controller 500 is coupled to the system 10 in various embodiments. The controller 500 is configured to provide control data to those system components and receive process and/or status data from those system components. For example, the controller 500 comprises a microprocessor, a memory (e.g., volatile or non-volatile memory), and a digital I/O port capable of generating control voltages sufficient to communicate and activate inputs to the processing system 100, as well as monitor outputs from the system 10. In addition, a program stored in the memory is utilized to control the aforementioned components of the lithography system 10 according to a process recipe. Furthermore, the controller 500 is configured to analyze the process and/or status data, to compare the process and/or status data with target process and/or status data, and to use the comparison to change a process and/or control a system component. In addition, the controller 500 is configured to analyze the process and/or status data, to compare the process and/or status data with historical process and/or status data, and to use the comparison to predict, prevent, and/or declare a fault or alarm.

In accordance with the foregoing, improved debris mitigation is achieved in order to prevent mask fall-on defects and the like in a semiconductor manufacturing process. Taking advantages of the off period of the EUV light pulse generation cycle, a shutter is provided at the interface between the source and scanner chambers to pass EUV light during on period of the light pulse and block nanoparticle debris when the EUV pulse is off. In such manner, no additional purge gas flow is needed to improve debris collection. Furthermore, excessive power usage is avoided because the shutter will be disengaged when the lithography apparatus 10 is idle and not generating nanoparticle debris.

According to various embodiments, an extreme ultra violet (EUV) lithography apparatus includes a light source that generates a light pulse and nanoparticle debris. A scanner receives the light from a junction with the light source and directs the light to a reticle stage. A shutter is disposed at the junction. The shutter has one or more blades that periodically blocks the junction when the light pulse is off so that the nanoparticle debris does not enter the scanner. In some embodiments, the apparatus further has a controller that synchronizes a position of the blade with a generation of the light pulse so that the blade blocks the junction during the times when the light pulse is off. In some embodiments, the shutter is disposed in the scanner proximate the junction. In some embodiments, the apparatus includes an intermediate focus through which the light pulse and the nanoparticle debris flow towards the junction. In some embodiments, the shutter is disposed at the intermediate focus before the junction. In some embodiments, intermediate focus further has at least one nozzle for introducing a gas to direct at least some of the nanoparticles away from the scanner. In some embodiments, the apparatus has a debris collector disposed at the intermediate focus that collects nanoparticle debris blocked by the shutter. In some embodiments, the shutter comprises one rotating blade having at least one gap configured to allow the light pulse to pass the junction when the light pulse is on. In some embodiments, the shutter comprises a plurality of rotating blades, each of which having a width that blocks the junction during an off period of the light pulse. In some embodiments, each of the rotating blades are separated by a gap having a width that corresponds to an on period of the light pulse while the shutter is rotating. In some embodiments, the shutter comprises a plurality of blades that move inward to decrease a size of an aperture formed at the junction by the blades when the light pulse is off and move outward to increase the size of the aperture in order to allow the light pulse to pass when the light pulse is on. In some embodiments, the blade comprises a plate that moves in a lateral direction to block the junction when the light pulse is off and to clear the junction when the light pulse is on.

According to various embodiments, an apparatus for an extreme ultra violet (EUV) lithography includes an EUV source that generates light and nanoparticle debris and a scanner that receives the light and directs the light to a reticle stage. A shutter is disposed at a junction of the source and the scanner, which blocks the nanoparticle debris without blocking the light. A debris catcher is further provided to catch nanoparticle debris deflected or blocked by the shutter. In some embodiments, the debris catcher is disposed in the source. In some embodiments, the shutter is disposed in the scanner. In some embodiments, the shutter comprises a rotating blade that periodically blocks the junction when light is not generated. In some embodiments, the apparatus further includes a controller that synchronizes a rotation of the blade with a generation of the light.

According to various embodiments, a method of operating an extreme ultra violet (EUV) lithography system having an EUV source includes: (i) generating a laser produced plasma (LPP) and nanoparticles in the EUV source; (ii) directing light from the LPP to a scanner; and (iii) synchronizing a shutter disposed at a junction of the EUV source and the scanner such that a blade blocks the junction during an off period of the LPP, thereby deflecting nanoparticles away from the scanner during the off period. In some embodiments, the shutter is synchronized so that a gap coincides with the junction during an on period of the LPP, thereby allowing the LPP to pass from the source to the scanner. In some embodiments, the blade moves with respect to the junction in at least one of a rotational direction and a linear direction.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultra violet (EUV) lithography apparatus, comprising:
   a light source that generates a light pulse and nanoparticle debris;
   a scanner that receives the light from a junction with the light source and directs the light to a reticle stage; and
   a shutter disposed near the junction, the shutter having at least one rotating blade that periodically blocks the junction when the light pulse is off so that the nanoparticle debris do not enter the scanner,
   wherein the shutter comprises a plurality of rotating blades, each of the rotating blades having a width that blocks the junction during an off period of the light pulse, and
   wherein each of the rotating blades is separated by a gap having a width that corresponds to an on period of the light pulse while the shutter is rotating.

2. The apparatus of claim 1, further comprising a controller configured to control a synchronization of a position of the rotating blades with a generation of the light pulse so that the rotating blades block the junction during the times when the light pulse is off.

3. The apparatus of claim 1, wherein the shutter is disposed in the scanner proximate the junction.

4. The apparatus of claim 1, further comprising an intermediate focus through which the light pulse and the nanoparticle debris flow towards the junction.

5. The apparatus of claim 4, wherein the shutter is disposed at the intermediate focus before the junction.

6. The apparatus of claim 4, wherein the intermediate focus comprises at least one nozzle for introducing a gas to direct at least some of the nanoparticle debris away from the scanner.

7. The apparatus of claim 4, further comprising a debris collector disposed at the intermediate focus that collects nanoparticle debris blocked by the shutter.

8. A method for extreme ultra violet (EUV) lithography, comprising:
generating EUV light and nanoparticle debris,
directing the EUV light to a reticle stage;
blocking the nanoparticle debris with a shutter without blocking the light; and
catching the nanoparticle debris deflected by the shutter,
wherein the shutter comprises a plurality of rotating blades, each of the rotating blades having a width that blocks the junction during an off period of the light pulse, and
wherein each of the rotating blades is separated by a gap having a width that corresponds to an on period of the light pulse while the shutter is rotating.

9. The method of claim 8, wherein said catching is performed by a debris catcher disposed in an EUV source.

10. The method of claim 8, wherein the shutter is disposed in a scanner connected to the EUV source.

11. The method of claim 8, wherein the rotating blades periodically block the junction when the EUV light is not generated.

12. The method of claim 11, further comprising synchronizing a rotation of the blade with the generating EUV light.

13. A method of operating an extreme ultra violet (EUV) lithography system including an EUV source, comprising:
generating a laser produced plasma (LPP) and nanoparticles in the EUV source;
directing light from the LPP to a scanner;
synchronizing a shutter disposed at a junction of the EUV source and the scanner such that a rotating blade blocks the junction during an off period of the LPP, thereby deflecting nanoparticles away from the scanner during the off period,
wherein the shutter comprises a plurality of rotating blades, each of the rotating blades having a width that blocks the junction during an off period of the light pulse, and
wherein each of the rotating blades is separated by a gap having a width that corresponds to an on period of the light pulse while the shutter is rotating.

14. The method of claim 13, further comprising:
synchronizing the shutter so that a gap coincides with the junction during an on period of the LPP, thereby allowing the LPP to pass from the source to the scanner.

15. The apparatus of claim 1, wherein the plurality of rotating blades are connected at a central point thereby forming a fan configuration.

16. The apparatus of claim 15, wherein the plurality of rotating blades are disposed equidistantly around the central point.

* * * * *